US006825721B2

(12) United States Patent
Sanchez et al.

(10) Patent No.: US 6,825,721 B2
(45) Date of Patent: Nov. 30, 2004

(54) AMPLIFIER GAIN BOOST CIRCUITRY AND METHOD

(75) Inventors: Stephen J. Sanchez, Tucson, AZ (US); Vadim V. Ivanov, Tuscon, AZ (US); Walter B. Meinel, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 275 days.

(21) Appl. No.: 10/193,871

(22) Filed: Jul. 12, 2002

(65) Prior Publication Data

US 2004/0008086 A1 Jan. 15, 2004

(51) Int. Cl.[7] ................................................. H03F 3/45
(52) U.S. Cl. ....................... 330/253; 330/254; 330/258; 327/52
(58) Field of Search ...................... 327/52, 54; 330/253, 330/254, 255, 259, 260, 265

(56) References Cited

U.S. PATENT DOCUMENTS 5,847,607 A * 12/1998 Lewicki et al. ............. 330/258
6,150,883 A    11/2000 Ivanov ........................ 330/253
6,236,270 B1 *  5/2001 Takeuchi ..................... 330/253
6,356,153 B1 *  3/2002 Ivanov et al. ............... 330/253

OTHER PUBLICATIONS

"The CMOS Gain-Boosting Technique" by Klass Bult and Govert J.G.M. Geelen, Analog Integrated Circuits and Signal Processing I, 1991, pp. 119-135.

* cited by examiner

Primary Examiner—Tuan T. Lam
Assistant Examiner—Hiep Nguyen
(74) Attorney, Agent, or Firm—W. Daniel Swayze, Jr.; W. James Brady; Frederick J. Telecky, Jr.

(57) ABSTRACT

A gain boost circuit is provided in a differential amplifier including differentially connected first and second input transistors the drains of which are coupled to sources of first and second cascode transistors. A third cascode transistor has a source coupled to a drain of the first cascode transistor and a drain coupled to a bias current source. A gain boost amplifier has an output coupled to the gate of the third cascode transistor, a first input coupled to the drain of the first cascode transistor, and a second input coupled to the drain of the second cascode transistor.

7 Claims, 7 Drawing Sheets

AMPLIFIER GAIN BOOST CIRCUITRY AND METHOD

BACKGROUND OF THE INVENTION

The invention relates to high-speed CMOS operational amplifiers, and particularly to gain boost circuitry that increases amplifier gain without increasing noise and without increasing amplifier instability.

The closest prior art is thought to be represented by commonly assigned U.S. Pat. No. 6,150,883 issued Nov. 21, 2000 to Ivanov and U.S. Pat. No. 6,356,153 issued Mar. 12, 2002 to Ivanov et al., both incorporated herein by reference, disclose prior gain boost circuitry. Also, see "The CMOS Gain-Boosting Technique" by K. Bult and G. Geelan in "Analog Integrated Circuits and Signal Processing", Volume I, pp 119–135 (1981).

Figure 3:
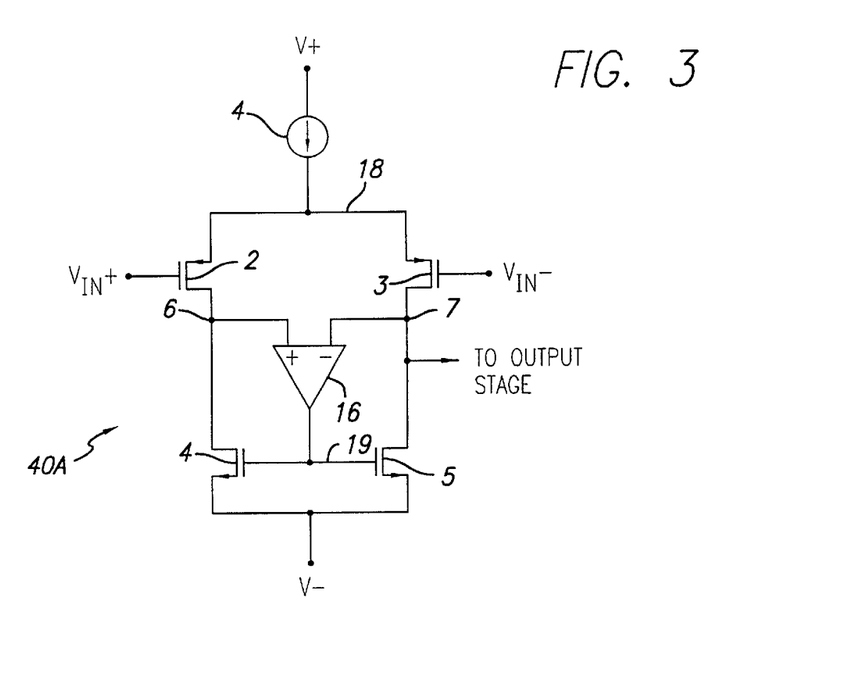
FIG. 3 is a schematic diagram of a simple CMOS differential input stage including a gain boost amplifier according to the present invention.

A variety of CMOS current mirror circuits are generally known in art, particularly the current mirror which is incorporated within the single stage CMOS amplifier 40A shown in FIG. 3. That prior art current mirror includes P-channel transistors 4 and 5 and amplifier 16. However, the prior art does not disclose use of that current mirror as a gain boost circuit in a CMOS differential amplifier as shown in FIG. 3.

Figure 1A:
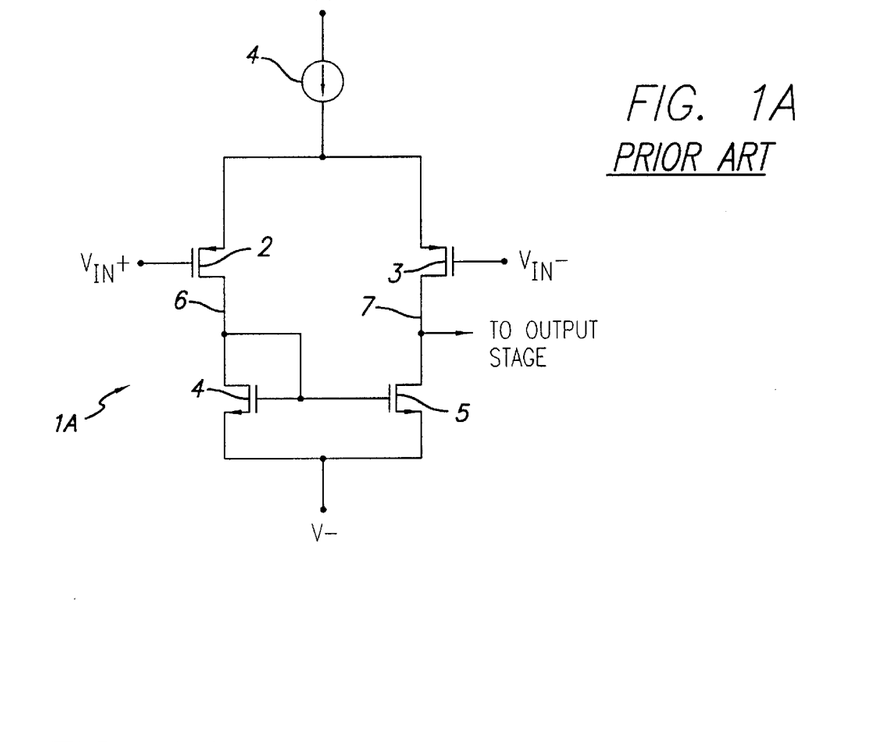
FIG. 1A is a schematic diagram of simple prior art CMOS differential input stage.

FIG. 1A shows a conventional CMOS differential amplifier input stage 1A including two differentially connected P-channel input transistors 2 and 3 having their sources connected to a tail current source 4. The drain of transistor 2 is connected by conductor 6 to a current mirror load circuit including N-channel transistors 4 and 5, the gates of which are connected to conductor 6. The sources of transistors 4 and 5 are connected to a low supply voltage V−, and the drain of transistor 5 and the drain of transistor 3 are connected by conductor 7 to an output stage (not shown).

Figure 1B:
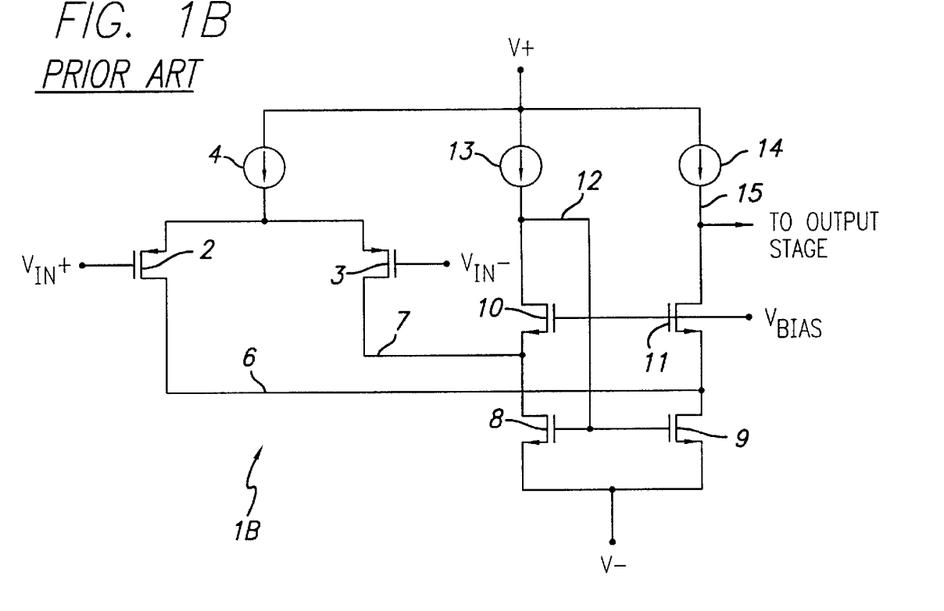
FIG. 1B is a schematic diagram of a simple prior art CMOS differential input stage including folded cascode circuitry.

FIG. 1B shows another conventional CMOS differential amplifier input stage 1B in which input transistors 2 and 3 are connected as in FIG. 1A. However, in FIG. 1B the drains of input transistors 2 and 3 are connected by conductors 6 and 7 not only to N-channel load transistors 8 and 9, but also to N-channel cascode transistors 10 and 11 of a folded cascode circuit which also includes current sources 13 and 14. Specifically, conductor 7 is connected to the drain of load transistor 8 and to the source of cascode transistor 10, which has its drain connected by conductor 12 to the gates of load transistors 8 and 9 and to one terminal of current source circuit 13. Conductor 8 is connected to the drain of load transistor 9 and the source of cascode transistor 11, which has its drain connected to output conductor 15 and to current source circuit 14.

The voltage gain A of both of differential input stages 1A and 1B is given by the expression $A=g_m R_{out}$, where $R_{out}$ is the equivalent differential resistance at the drains of the differential input transistors 2 and 3. Usually, an output stage (not shown) has a CMOS input transistor the gate of which is connected to the output of the differential input stage 1A or 1B. Therefore, $R_{out}$ of the differential input stage is dominated by the drain impedances of the transistors connected to output conductor 7 of FIG. 1A or output conductor 15 of FIG. 1B. The voltage gain of the input stage 1A of FIG. 1A and the input stage 1B of FIG. 1B typically is roughly 10 to 20, and usually does not exceed 100 (although it is possible for the voltage gain of input stage 1B of FIG. 1B to be as high as 1000, due to the cascode circuitry.)

Figure 2:
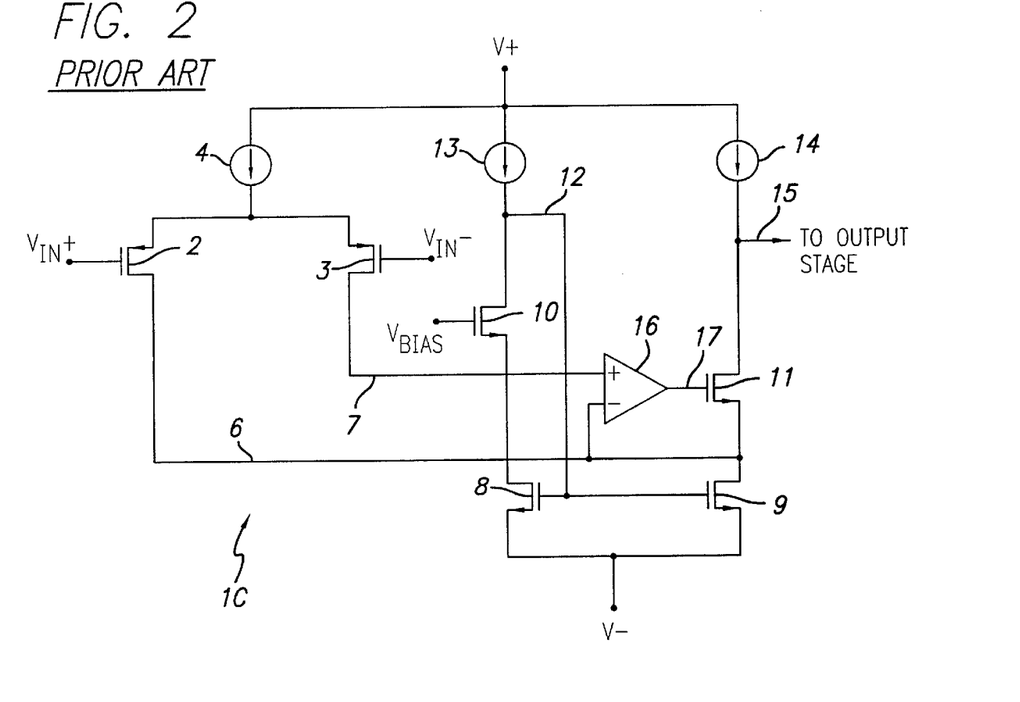
FIG. 2 is a schematic diagram of a simple prior art CMOS differential input stage coupled to folded cascode circuitry and including a gain boost amplifier.

To achieve higher voltage gain in single stage differential amplifier circuits including folded cascode circuitry such as that shown in FIGS. 1A and 1B, gain boost circuits such as those disclosed in above mentioned commonly owned U.S. Pat. Nos. 6,150,883 and 6,356,153 and the above mentioned article by K. Bult and G. Geelan have been provided. FIG. 2 illustrates such a prior art differential amplifier input stage including such a gain boost circuit 16, wherein the (+) and (−) inputs of gain boost amplifier 16 are connected to conductors 7 and 6, respectively. The gate of cascode transistor 11 is connected to the output of gain boost amplifier 16, instead of to $V_{BIAS}$. If the gain boost amplifier is configured as a voltage-input amplifier in the technique shown in FIG. 2, it introduces stability problems and complicates compensation of the amplifier circuit within which the differential amplifier input stage is included. However, if gain boost amplifier 16 is configured as a current-input amplifier to avoid the instability problem, that introduces additional undesirable noise and offset.

It should be understood that one skilled in art who desires to increase the gain of the differential amplifier shown in FIG. 2 by using the disclosed prior art gain boost technique faces several problems. If he/she wishes to use a voltage-input configuration for the gain boost amplifier 16, the differential amplifier circuit is likely to be quite unstable and require use of costly and inconvenient compensation circuitry. However, if he/she wishes to use a current-input configuration for the gain boost amplifier 16, that introduces additional undesirable noise and offset. In either case, some applications require a much larger voltage gain, e.g. greater than 120 dB, in which case a more complex multi-stage amplifier must be designed. Stated differently, differential amplifier shown in prior art FIG. 2 can provide only 30–40 dB of gain boost, which is not enough gain for many applications, and the noise or instability caused by use of the gain boost circuit 16 may be unacceptable. In such cases, the only available technique for achieving the gain is to provide a multi-stage amplifier, which may be unduly expensive; also, use of multiple amplifying stages slows down overall amplifier performance, requires additional compensation circuitry, and consumes much more current than a single stage amplifier.

Therefore, there is an unmet need for a circuit technique for increasing the open loop gain of a CMOS differential amplifier stage and associated output stage without introducing an unacceptable amount of additional noise, without introducing circuit instability and corresponding compensation problems, and/or without adding additional main gain stages in the signal path.

SUMMARY OF THE INVENTION

Accordingly, it is an object of the invention to provide an inexpensive, high-speed CMOS amplifier having a gain boost stage which provides substantially increased amplifier gain without introducing of additional noise and which does not cause an unacceptable amount of circuit instability and corresponding compensation problems.

It is another object of the invention to provide an inexpensive, high-speed CMOS amplifier having a gain boost stage which provides substantially increased amplifier gain without introducing additional noise and which does not cause an unacceptable amount of circuit instability and corresponding compensation problems and which renders insignificant any changes in amplifier gain caused by changes in a load driven by the amplifier.

It is another object of the invention to provide circuitry which constitutes a high precision current mirror and which can be used to provide increased gain in a CMOS amplifier.

It is another object of the invention to provide an inexpensive, high-speed CMOS amplifier without using multiple amplifying stages in the signal path.

Briefly described, and in accordance with one embodiment thereof, the invention provides a differential amplifier circuit including differentially connected first and second input transistors of a first channel type and a folded cascode current summing circuit coupled to a first supply voltage rail and including a first cascode transistor and a second cascode transistor both of the second channel type. The sources of the first and second cascode transistors are coupled to drains of the first and second input transistors, respectively. A bias source provides a bias signal on gates of the first and second cascode transistors, respectively. A third cascode transistor of the second channel type has a source coupled to a drain of the first cascode transistor and a drain coupled to a first bias current source. A drain of the second cascode transistor is coupled to a second bias current source. A gain boost amplifier has an output coupled to the gate of the third cascode transistor, a first input coupled to the drain of the first cascode transistor, and a second input coupled to the drain of the second cascode transistor. An output stage can be provided including a pull-up transistor of the second channel type coupled between the first supply voltage rail and the output terminal, and a second output transistor of the first channel type coupled between the second supply voltage rail and the output terminal. A class AB bias circuit can be coupled between the gate electrodes of the pull-up and pull-down transistors.

In another embodiment, the invention provides a differential amplifier circuit including first (V−) and second (V+) supply voltage rails, first (V$_{IN}$+) and second V$_{IN}$−) input terminals, an output terminal, differentially connected first (2) and second (3) input transistors of a first channel type and a folded cascode circuit coupled to the first supply voltage rail (V−) and including a first cascode transistor (11) and a second cascode transistor (10) both of a second channel type, sources of the first (11) and second (10) cascode transistors being coupled to drains of the first (2) and second (3) input transistors, respectively. A first load transistor (8) of the first channel type is coupled between the source of the second cascode transistor (10) and the first supply voltage rail (V−) and a second load transistor (9) of the first channel type is coupled between the source of the first cascode transistor (11) and the first supply voltage rail (V−). A bias source (V$_{BIAS}$) produces a bias signal on gates of the first and second cascode transistors, respectively. A gain boost amplifier (16) has a first input (+) coupled to the drain of the second cascode transistor (10), a second input (−) coupled to the drain of the first cascode transistor (11), and an output coupled to gates of the first (8) and second (9) load transistors.

In another embodiment, the invention provides a differential amplifier circuit including first (V−) and second (V+) supply voltage rails, first (V$_{IN}$+) and second (V$_{IN}$−) input terminals, an output terminal, differentially connected first (2) and second (3) input transistors of a first channel type, and a folded cascode circuit coupled to the first supply voltage rail (V−) and including a cascode transistor (11) of a second channel type, a source of the cascode transistor (11) being coupled to a drain of the first input transistor (2). A first load transistor (8) of the first channel type is coupled between a first current source (13) and the first supply voltage rail (V−) and a second load transistor (9) of the first channel type is coupled between the source of the cascode transistor (11) and the first supply voltage rail (V−). A bias source (V$_{BIAS}$) produces a bias signal on a gate of the cascode transistor (11). A gain boost amplifier (16) has a first input (+) coupled to a drain of the first load transistor (8), a second input (−) coupled to the source of the cascode transistor (11), and an output coupled to gates of the first (8) and second (9) load transistors.

In yet another embodiment, the invention provides a differential amplifier circuit including first (V−) and second (V+) supply voltage rails, first (V$_{IN}$+) and second (V$_{IN}$−) input terminals, an output terminal, differentially connected first (2) and second (3) input transistors of a first channel type, a first load transistor (8) of the first channel type coupled between a drain of the first input transistor (2) and the first supply voltage rail (V−), and a second load transistor (9) of the first channel type coupled between a drain of the second input transistor (3) and the first supply voltage rail (V−). A gain boost amplifier (16) includes a first input (+) coupled to the drain of the first input transistor (2), a second input (−) coupled to the drain of the second input transistor (3), and an output coupled to gates of the first (8) and second (9) load transistors.

The invention also provides a method of operating a differential amplifier circuit (40D) which includes first (V−) and second (V+) supply voltage rails, first (V$_{IN}$+) and second (V$_{IN}$−) input terminals, and an output terminal (15), differentially connected first (2) and second (3) input transistors of a first channel type, and a folded cascode circuit coupled to the first supply voltage rail (V−) and including a first cascode transistor (11) and a second cascode transistor (10) both of a second channel type, sources of the first (11) and second (10) cascode transistors being coupled to drains of the first (2) and second (3) input transistors, respectively, the sources of the first (11) and second (10) cascode transistors also being coupled to a drain of a first load transistor (9) and a drain of a second load transistor (8), respectively. The method includes boosting the gain of the differential amplifier circuit (40D) without introducing additional components into a signal path of the differential amplifier circuit by providing local feedback representative of an output voltage (15) of the differential amplifier circuit to gates of the first (9) and second (8) load transistors by coupling a drain of a third cascode transistor (33) of the second channel type to a current source circuit (13) and coupling a source of the third cascode transistor (33) to a drain of the second cascode transistor (10), coupling a drain of the third cascode transistor (33) to gates of the first (8) and second (9) load transistors, and driving a gate of the third cascode transistor (33) by means of a gain boost amplifier (16) having a first input (+) coupled to the drain of the first cascode transistor (11) and a second input (−) coupled to the drain of the second cascode transistor (10), to accomplish the function of increasing the output impedance of the differential amplifier circuit (40D).

In another embodiment, the invention provides a method of operating a differential amplifier circuit (40E) which includes first (V−) and second (V+) supply voltage rails, first (V$_{IN}$+) and second (V$_{IN}$−) input terminals, and an output terminal (15), differentially connected first (2) and second (3) input transistors of a first channel type, and a folded cascode circuit coupled to the first supply voltage rail (V−) and including a first cascode transistor (11) and a second cascode transistor (10) both of a second channel type, sources of the first (11) and second (10) cascode transistors being coupled to drains of the first (2) and second (3) input transistors, respectively, the sources of the first (11) and second (10) cascode transistors also being coupled to a drain of a first load transistor (9) and a drain of a second load transistor (8), respectively. The method includes boosting the gain of the differential amplifier circuit without introducing additional components into a signal path of the differential amplifier circuit by providing local feedback representative of an output voltage (15) of the differential amplifier circuit to gates of the first (9) and second (8) load transistors by coupling a first input (−) of a gain boost amplifier (16) to a drain of the first cascode transistor (11), and coupling a second input (+) of the gain boost amplifier (16) to a drain of the second cascode transistor (10), and coupling an output of the gain boost amplifier (16) to gates of the first (9) and second (8) load transistors to drive the first (9) and second (8) load transistors so as to accomplish the function of increasing the output impedance of the differential amplifier circuit (40E).

In another embodiment, the invention provides a method of operating a differential amplifier circuit (100E) which includes first (V−) and second (V+) supply voltage rails, first ($V_{IN}$+) and second ($V_{IN}$−) input terminals, and an output terminal, differentially connected first (2) and second (3) input transistors of a first channel type, and a folded cascode circuit coupled to the first supply voltage rail (V−) and including a first cascode transistor (11) and a second cascode transistor (10) both of a second channel type, sources of the first (11) and second (10) cascode transistors being coupled to drains of the first (2) and second (3) input transistors, respectively, the sources of the first (11) and second (10) cascode transistors also being coupled to a drain of a first load transistor (9) and a drain of a second load transistor (8), respectively. The method includes boosting the gain of the differential amplifier circuit without introducing additional components into a signal path of the differential amplifier circuit by providing local feedback representative of an output voltage of the differential amplifier circuit to gates of the first (9) and second (8) load transistors by coupling a first input of a gain boost amplifier (16) to the source of the first cascode transistor (11), and coupling a second input of the gain boost amplifier (16) to the source of the second cascode transistor (10), coupling a drain of the second cascode transistor (10) to gates of the first (9) and second (8) load transistors, and coupling an output of the gain boost amplifier (16) to a gate of the second cascode transistor (10) to cause the drain of the second cascode transistor (10) to drive the gates of the first (9) and second (8) load transistors so as to accomplish the function of increasing the output impedance of the differential amplifier circuit.

In another embodiment, the invention provides a method of operating a differential amplifier circuit (40A) which includes first (V−) and second (V+) supply voltage rails, first ($V_{IN}$+) and second ($V_{IN}$−) input terminals, and an output terminal, differentially connected first (2) and second (3) input transistors of a first channel type, sources of the first (2) and second (3) input transistors being coupled to the drain of a first load transistor (4) and a drain of a second load transistor (5), respectively. The method includes boosting the gain of the differential amplifier circuit by providing local feedback representative of an output voltage of the differential amplifier circuit to gates of the first (8) and second (9) load transistors by coupling a first input (+) of a gain boost amplifier (16) to a drain of the first load transistor (4), and coupling a second input (−) of the gain boost amplifier (16) to a drain of the second load transistor (5), and coupling an output of the gain boost amplifier (16) to gates of the first (4) and second (5) load transistors to drive the first (4) and second (5) load transistors so as to accomplish the function of increasing the output impedance of the differential amplifier circuit.

In yet another embodiment, the invention provides a current mirror circuit including a supply voltage rail (V+), an input terminal (29), an output terminal (15A), a first transistor (10A), a second transistor (11A), a third transistor (8A) coupled between a source of the first transistor (10A) and the supply voltage rail (V+), and a fourth transistor (9A) coupled between a source of the second transistor (11A) and the supply voltage rail (V+). A first bias source ($V_{BIAS2}$) produces a bias signal on gates of the first and second transistors. A fifth transistor (33A) has a source coupled to a drain of the first transistor (10A) and a drain coupled to the input terminal (29), a drain of the second transistor (11A) is coupled to the output terminal (15A), a second bias source ($V_{BIAS2A}$) coupled to gates of the third (8A) and fourth (9A) transistors. An amplifier (16) has a first input (−) coupled to the drain of the second transistor (11A), a second input (+) coupled to the drain of the first transistor (10A), and an output coupled to a gate of the fifth transistor (33A).

DETAILED DESCRIPTION OF THE PREFERRED EMBODIMENTS

Figure 4A:
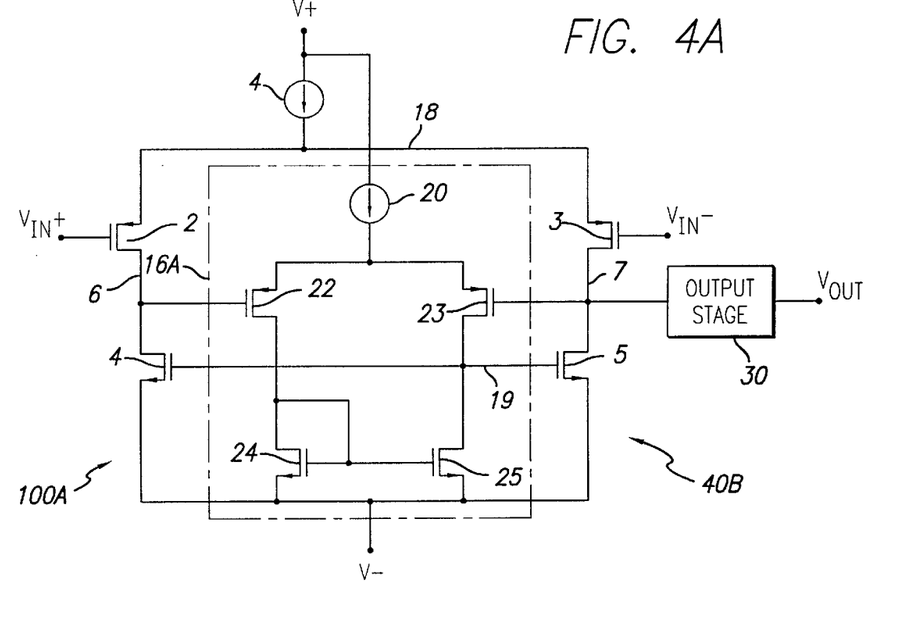
FIG. 4A is a schematic diagram of an implementation of the CMOS differential input stage of FIG. 3 wherein the gain boost amplifier receives a differential voltage input signal.
Figure 4B:
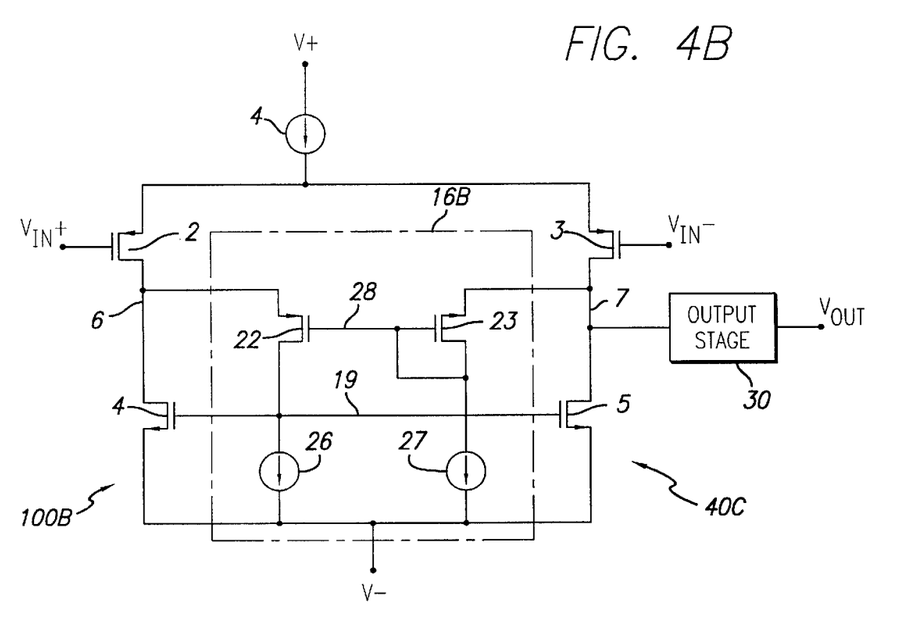
FIG. 4B is a schematic diagram of an implementation of the CMOS differential input stage of FIG. 3 wherein the gain boost amplifier receives a differential current input signal.

Referring to first to FIG. 3, differential amplifier input stage 40A includes P-type input transistors 2 and 3 having their sources connected by conductor 18 to one terminal of constant current source 4, the other terminal of which is connected to V+. The drain of transistor 2 is connected by conductor 6 to the drain of N-channel load transistor 4 and the (+) input of a gain boost amplifier 16. The drain of transistor 3 is connected by conductor 7 to the (−) input of gain boost amplifier 16 and to the drain of N-channel load transistor 5. The output of gain boost amplifier 16 is connected by conductor 19 to the gates of transistors 4 and 5, the sources of which are connected to V−. Conductor 7 typically applies the single-ended output 7 of differential amplifier input stage 40A to a suitable output stage (not shown). A voltage-input implementation of gain boost amplifier 16 is shown in FIG. 4A, and a current-input implementation of gain boost amplifier 16 is shown in FIG. 4B. The signal path from $V_{IN}+$ and $V_{IN}-$ to $V_{OUT}$ in differential input stage 40A passes through input transistors 2 and 3, gain boost amplifier 16, and the gate and drain of load transistor 5. Thus, gain boost amplifier 16 is in the signal path of differential input stage 40A. The voltage gain of differential input stage 40A is equal to the transconductance of the pair of input transistors 2 and 3 multiplied by the parallel combination of equivalent impedance at the output of current mirror 4,5 and the impedance at the drain of transistor 3. Gain boost amplifier 16 ensures that the output impedance of the current mirror 4,5 is very high, because the voltages of conductors 6 and 7 are forced to be nearly equal. Consequently, assuming that the load impedance connected to conductor 7 is high, the utilization of gain boost circuit 16 within differential input stage 40A as shown provides increased voltage gain.

In FIG. 4A, an operational amplifier 100A in includes differential amplifier input stage 40B with its single-ended output 7 connected to the input of output stage 30. A voltage-input implementation of gain boost amplifier 16 in differential amplifier input stage 40B is designated by reference numeral 16A, and includes differentially coupled P-channel input transistors 22 and 23 having their sources coupled by tail current source 20 to V+ and their gates connected to conductors 6 and 7, respectively. A suitable output stage 30 has an input connected to conductor 7 and produces $V_{OUT}$. (The well-known output stage shown in above-mentioned U.S. Pat. No. 6,150,883 and also shown in FIG. 6 herein can be used as output stage 30.) N-channel transistors 24 and 25 constitute a conventional current mirror load circuit. The drain of transistor 22 is connected to the drain and gate of load transistor 24 and the gate of transistor 25, and the drain of transistor 23 is connected by conductor 19 to the gates of load transistors 4 and 5 and the drain of transistor 25. The sources of current mirror load circuit transistors 24 and 25 are connected to V−.

In FIG. 4B, a current-input implementation of gain boost amplifier 16 in FIG. 3 is designated by reference numeral 16B, and includes differentially connected P-channel input transistors 22 and 23 having their sources connected to conductors 6 and 7, respectively. The gate of transistor 22 is connected by conductor 28 to the gate and drain of transistor 23 and to a current source load circuit 27. The drain of transistor 22 is connected by conductor 19 to the gate of load transistors 4 and 5, and to one terminal of current source load circuit 26. The other terminals of current source load circuits 26 and 27 are connected to V−. The operational amplifier obtained by combining differential amplifier input stage 40C and output stage 30 is designated by reference numeral 100B. The differential amplifier input stage circuits of FIGS. 3, 4A and 4B do not include folded-cascode circuitry, so single-supply operation is not practical. However, these circuits consume less current than differential amplifier input stage circuits including folded-cascode circuitry, and can be used as internal amplifiers within other amplifier circuitry. Also, the differential amplifier input stage circuits of FIGS. 3, 4 and 4B provide more gain than prior art circuits of FIGS. 1A, 1B and 2.

Figure 5A:
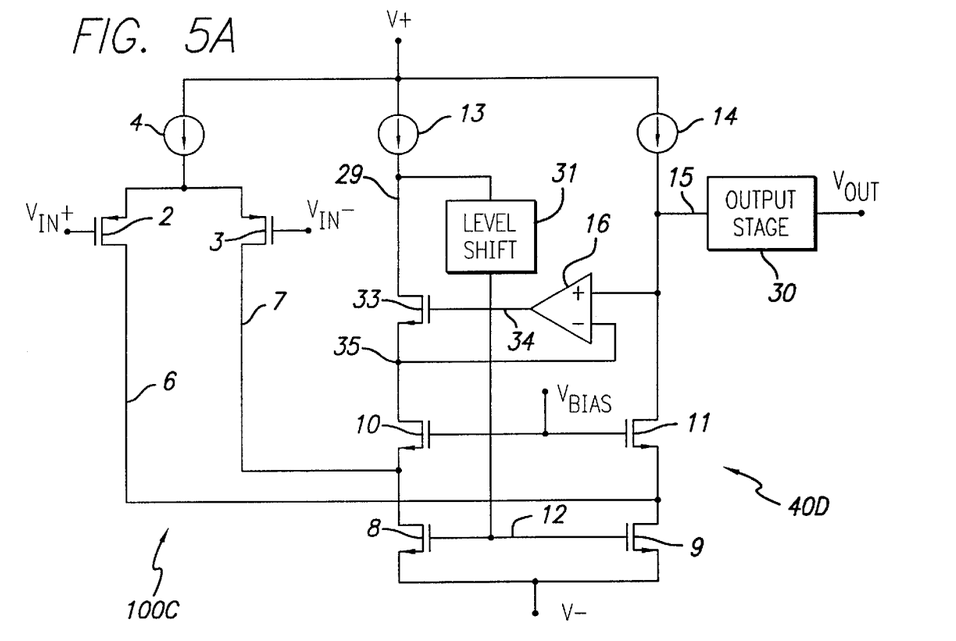
FIG. 5A is a schematic diagram of a CMOS differential amplifier stage coupled to a folded cascode circuitry of the present invention including improved gain boost amplifier circuitry.
Figure 6:
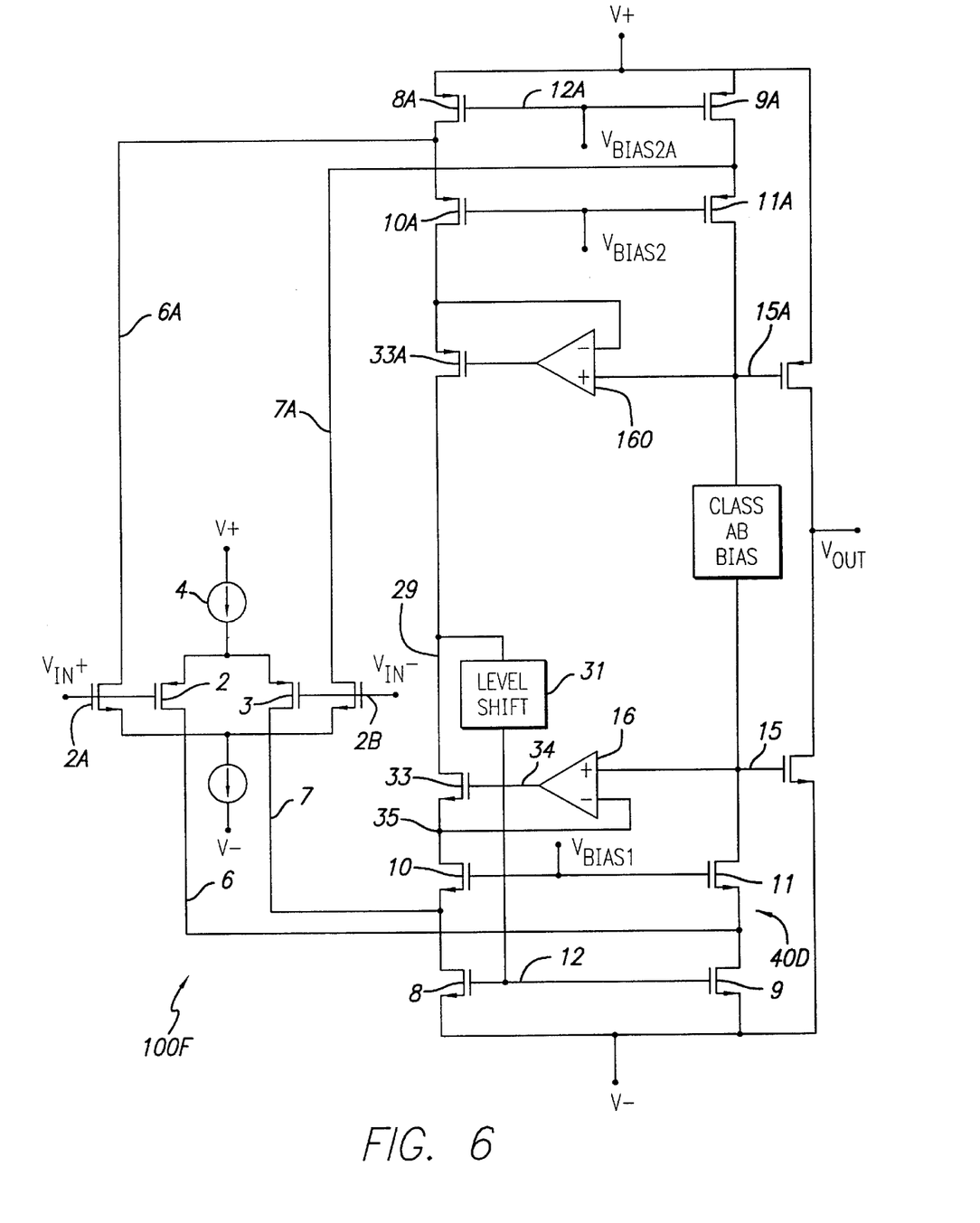
FIG. 6 is a schematic diagram showing implementations of the CMOS differential amplifier stage of FIG. 5A in a rail-to-rail operational amplifier.

Referring to FIG. 5A, an operational amplifier 100C includes a CMOS differential amplifier input stage 40D and an output stage 30. The CMOS differential amplifier input stage 40D includes P-channel input transistors 2 and 3 coupled to folded cascode circuitry and gain boost circuitry, and applies a single-ended output on conductor 15 to an input of output stage 30 to produce $V_{OUT}$ in response to $V_{IN}+$ and $V_{IN}-$, which are applied to the gates of transistors 2 and 3, respectively. Note that if output stage 30 is an inverting output stage (as shown in FIG. 6) then $V_{IN}+$ and $V_{IN}-$ are applied to the gates of input transistors 2 and 3, respectively, as shown. However, if the output stage 30 is a non-inverting stage, then the coupling of $V_{IN}+$ and $V_{IN}-$ to input transistors 2 and 3 shown in FIG. 5A should be reversed.) The drains of input transistors 2 and 3 are connected by conductors 6 and 7 to the drains of N-channel load transistors 9 and 8, respectively, as in Prior Art FIG. 2. (Note that load transistors 8 and 9 are generally considered to be part of the folded cascode circuit.) N-channel cascode transistors 10 and 11 have their sources connected to conductors 7 and 6, respectively and their gates connected to $V_{BIAS}$. The drain of cascode transistor 11 is connected by conductor 15 to the (+) input of gain boost amplifier 16, to the input of output stage 30, and to one terminal of current source 14, the other terminal of which is connected to V+.

The output of gain boost amplifier 16 is connected by conductor 34 to the gate of a third N-channel cascode transistor 33, the source of which is connected by conductor 35 to the drain of cascode transistor 10 and to the (−) input of gain boost amplifier 16. The drain of cascode transistor 33 is connected by conductor 29 to one terminal of a level shift circuit 31 and to one terminal of a current source circuit 13, the other terminal of which is connected to V+. The other terminal level shift circuit 31 is connected by conductor 12 to the gates of load transistors 8 and 9, the sources of which are connected to V−. Level shift circuit 31 provides "head room" for the third cascode transistor 33, so that its drain-to-source voltage is greater than 0 while an appropriate voltage is being applied to the gates of load transistors 8 and 9. (Note that the amount of headroom trades-off directly with the minimum required operating voltage, where the operating voltage is defined here as $V_{OP} \equiv (V+)-(V-)$. (More headroom offers a wider voltage range on conductor 15 but requires higher $V_{OP}$. Less headroom allows lower $V_{OP}$, critical for low supply voltage applications, at the expense of less voltage range on conductor 15, i.e., output stage drive.) The signal path from $V_{IN}+$ and $V_{IN}-$ to $V_{OUT}$ in differential input stage 40D passes through the gates and drains of input transistors 2 and 3 and through cascode transistors 10 and 11, so gain boost amplifier 16 is not in the signal path. The amplifier of FIG. 5A has the advantages of increased gain and improved stability over the prior art circuits. When the voltage of conductor 15 increases, gain boost amplifier 16 operates to increase the gate voltage of transistor 33 to keep the voltage on conductor 35 equal to the voltage on conductor 15. That means the output current of the folded cascode circuitry through the drain of cascode transistor 11 is determined by current source 13 and the difference between the input currents, i.e., the drain currents of transistors 2 and 3, as long as the combination of transistor 33 and gain boost amplifier 16 has sufficiently high gain, so the output impedance of folded cascode circuitry remains very high. The circuit of FIG. 5A operates to make the drain terminals of both of the cascode transistors 10 and 11 in the folded-cascode stage track in the presence of changing output voltage on conductor 15. The voltage on conductor 35 is forced to track the voltage on conductor 15 via the control loop including gain boost amplifier 16 and cascode transistor 33. Hence, the drain-to-source-voltages of cascode transistors 33 and 11 track as the output voltage on conductor 15 is driven. In contrast, this concept is not present in prior art. For example, in FIG. 1B, the voltage on conductor 12 is fixed while the voltage on conductor 15 is connected to the output stage and therefore is variable. Consequently, the drain-to-source-voltages of transistors 10 and 11 differ as the output voltage is driven.

Hence, a current-mirror-like arrangement that provides an extremely high output impedance is at the core of the present invention. The application of this current-mirror-like arrangement in a folded-cascode amplifier stage provides extremely high gain and can be made to operate at high speed by using of minimum channel length transistors 10 and 11, which are acceptable because of the increased gain achieved by use of the boost circuit 16 as shown. To go further, the use of an extremely high gain folded-cascode amplifier stage in a two stage amplifier topology provides a compact, i.e. low cost, high speed amplifier capable of maintaining high gain for a very wide range of resistive loads.

Figure 5B:
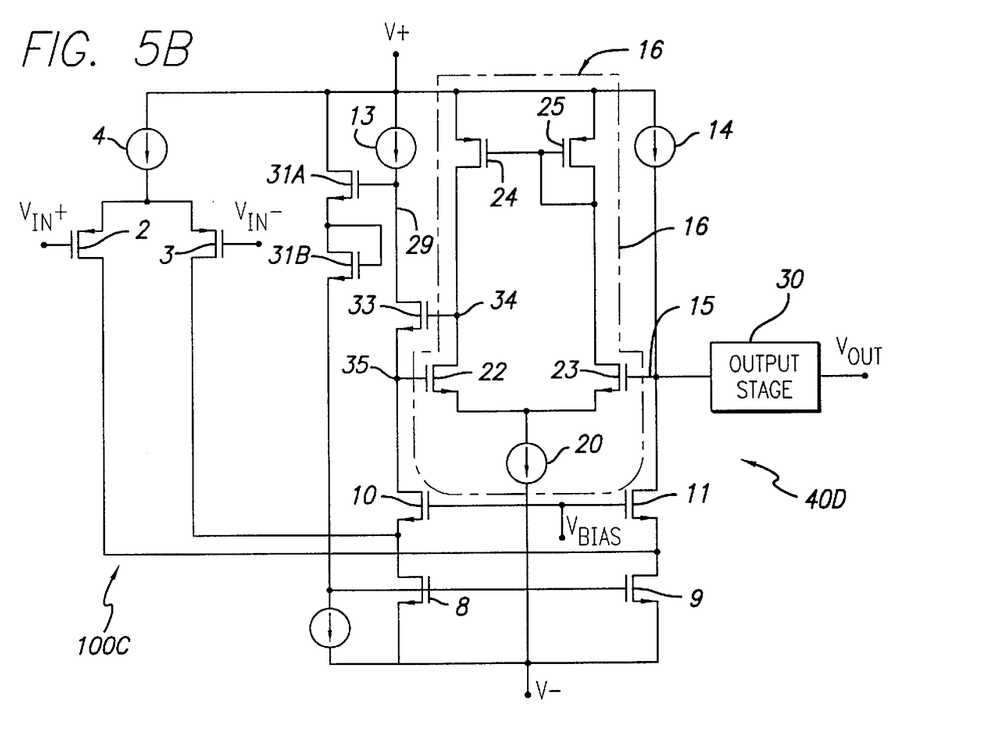
FIG. 5B is a schematic diagram of an implementation of the CMOS differential input stage of FIG. 5A wherein the gain boost amplifier receives a differential voltage-input signal.

FIG. 5B shows operational amplifier 100C of FIG. 5A with a voltage-input implementation of gain boost amplifier 16 including N-channel input transistors 22 and 23 with their sources coupled to V− by a tail current source 20 and their drains connected to a P-channel current mirror load circuit including transistors 24 and 25. The drain of transistor 22 is connected by conductor 34 to the gate of third cascode transistor 33 and to the drain of load transistor 24. The gate of transistor 22 is connected to conductor 35. The drain of transistor 23 is connected to the gate and drain of load transistor 25 and to the gate of load transistor 24. The gate of transistor 23 is connected to the output conductor 15 of differential amplifier stage 40D. Level shift circuit 31 of FIG. 5A is implemented in FIG. 5B by means of source follower transistor 31A and diode-connected transistor 31B and a bias current source coupled series between V+ and V− as shown. This configuration requires a minimum operating voltage, $V_{OP(MIN)} = V_{GS(8,9)} + V_{GS(31B)} + V_{GS(31A)} + V_{dsat(13)}$, where $V_{dsat(13)}$ is the saturation voltage of the real current source symbolized by 13. Alternatively, if transistors 8 and 9 are sized such that their $V_{GS(8,9)} > (V_{Dsat(8)} + V_{Dsat(10)} + V_{Dsat(33)} + \Delta V_{15})$, where $V_{GS(8,9)}$ is the voltage at the gates of transistors 8 and 9 and $\Delta V_{15}$, is a small but acceptable range of voltage swing on conductor 15, then the level shift circuit block in FIG. 5A can be realized by a wire, i.e. shorting conductors 29 and 12 and $V_{OP(MIN)}$ can be reduced. Note that while a current-input implementation of gain boost amplifier 16 of FIG. 5A could be provided, there is no need to do so because the differential input stage 40D shown therein is very stable.

Figure 5C:
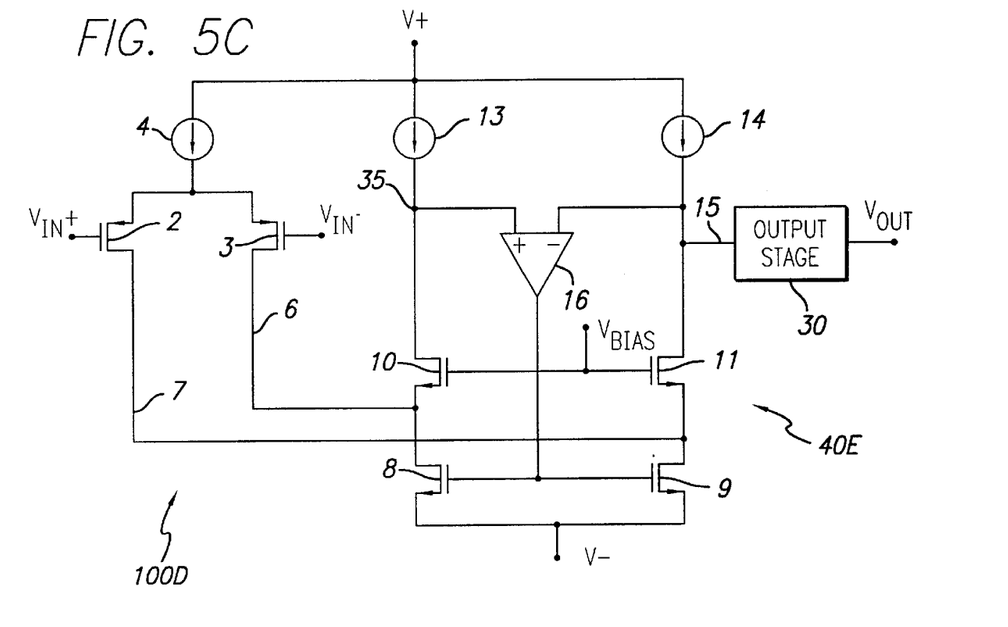
FIG. 5C is a schematic diagram of a CMOS differential amplifier stage coupled to another folded cascode circuit of the present invention including improved gain boost amplifier circuitry.

FIG. 5C shows an operational amplifier 100D including a differential folded cascode input stage 40E driving output stage 30. Gain boost amplifier 16 has a (+) input connected to the drain of cascode transistor 10 and one terminal of current source circuit 13, the other terminal which is connected to V+. The (−) input of gain boost amplifier 16 is connected by conductor 15 to one terminal of current source 14 and to the drain of cascode transistor 11. The output of gain boost amplifier 16 is connected to the gates of N-channel load transistors 8 and 9. The signal path from $V_{IN}+$ and $V_{IN}−$ to $V_{OUT}$ in differential input stage 40E passes through the gates and drains of input transistors 2 and 3 and the source and drain of cascode transistor 11 to conductor 15, and therefore does not pass through gain boost amplifier 16. The differential input stage 40E of FIG. 5C does not require use of the level shift or 31 of FIG. 5A and therefore can be used with lower amplitude supply voltages than the circuit of FIG. 5A. The differential input stage 40C of FIG. 5C also has substantially greater gain then the prior art circuits shown in FIG. 2.

Figure 5D:
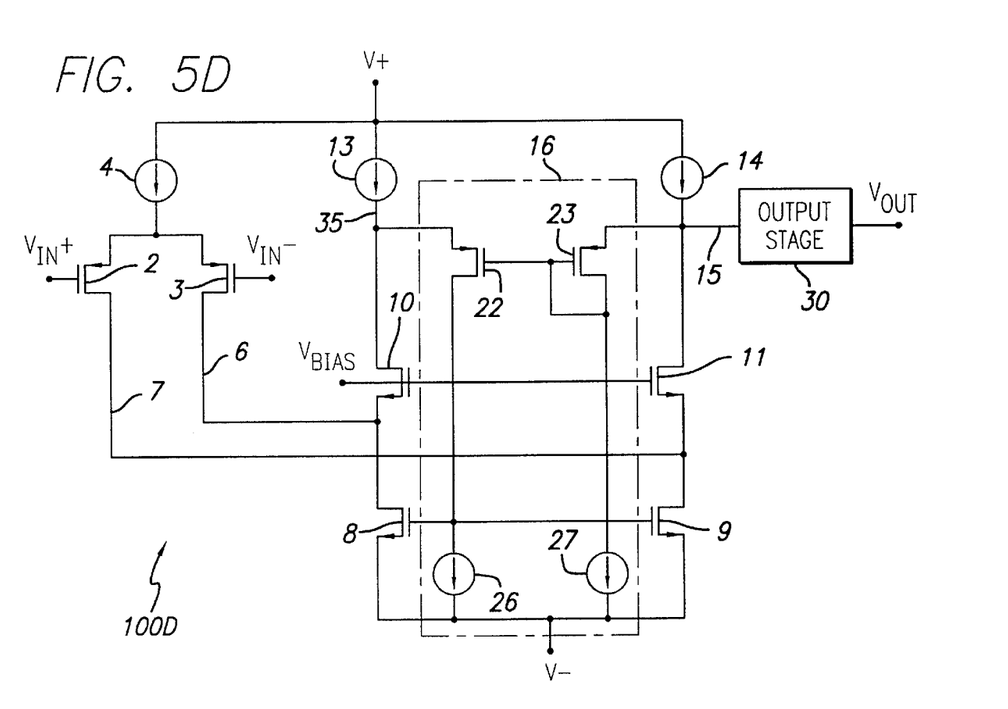
FIG. 5D is a schematic diagram of an implementation of the CMOS differential input stage of FIG. 5C wherein the gain boost amplifier receives a differential current input signal.

FIG. 5D shows operational amplifier 100D of FIG. 5C with a current-input implementation of gain boost amplifier 16 including differentially connected P-channel input transistors 22 and 23 having their sources connected conductor 35 and 15, respectively. The gate of transistor 22 is connected to the gate and drain of transistor 23. The drain of transistor 22 and 23 are coupled to V− by current load circuits 26 and 27, respectively. The drain of transistor 22 is connected to the gates of load transistors 8 and 9. (Note that use of a current-input rather than a voltage-input implementation of gain boost amplifier 16 substantially improves the circuit stability, but at the cost of an increased amount of noise.)

Figure 5E:
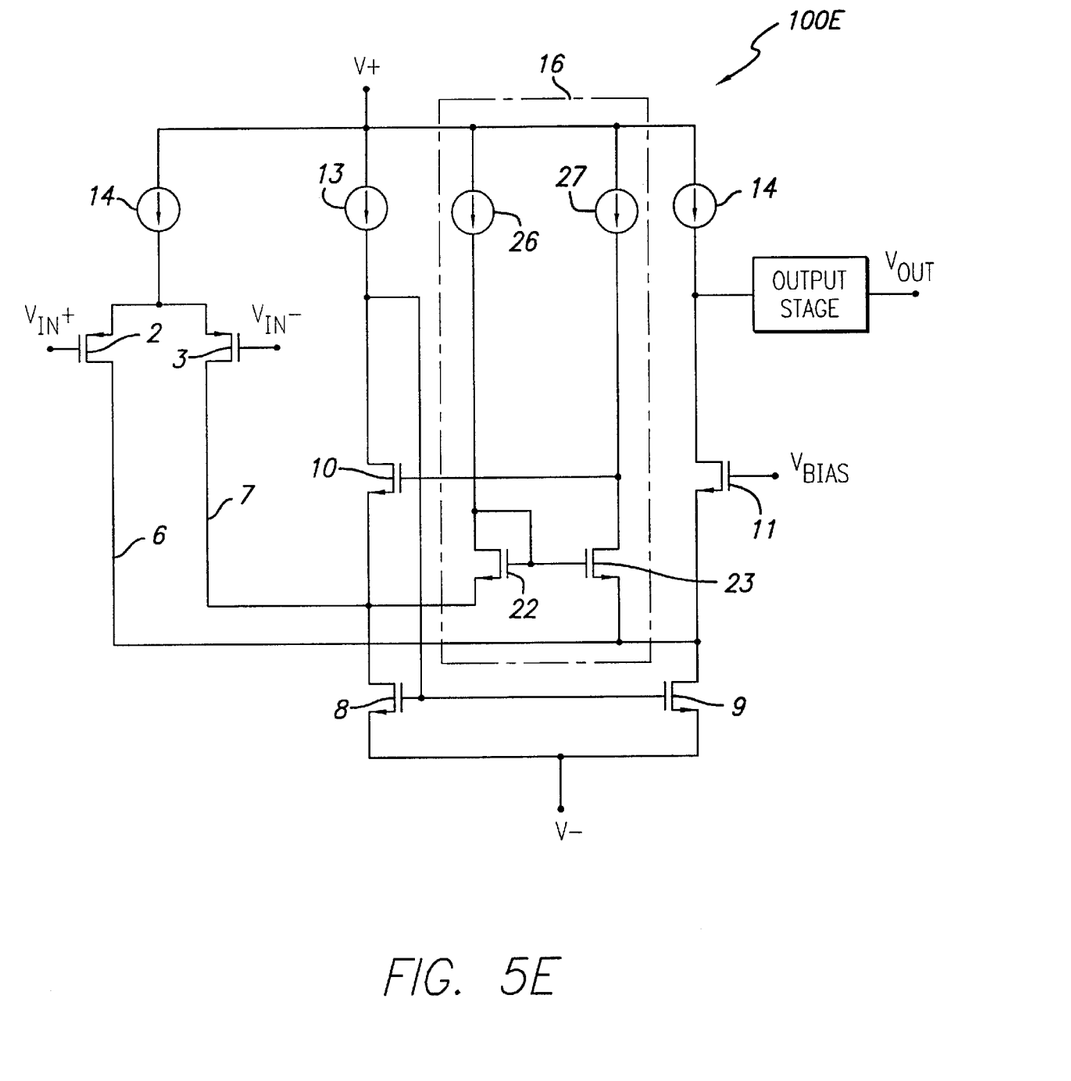
FIG. 5E is a schematic diagram of another CMOS differential amplifier stage coupled to folded cascode circuitry including gain boost amplifier circuitry.

FIG. 5E shows an operational amplifier 100E including a current-input implementation of gain boost circuit 16 that is similar to the circuit in Prior Art FIG. 2 except that the output of gain boost amplifier 16 is connected to the gate of cascode transistor 10 rather than cascode transistor 11. However, in the circuit of Prior Art FIG. 2 the signal path includes the gain boost amplifier. In contrast, in the circuit of FIG. 5E the signal path from $V_{IN}+$ and $V_{IN}−$ to $V_{OUT}$ in the differential input stage passes through the gates and drains of input transistors 2 and 3 and the source and drain of cascode transistor 11 to conductor 15, and therefore does not pass through gain boost amplifier 16. Consequently, the principles of operation of the circuit of FIG. 5E are very different from the circuit of Prior Art FIG. 2.

FIG. 6 is a schematic diagram showing a typical implementation of the CMOS differential amplifier stage of FIG. 5A that is included in a rail-to-rail operational amplifier 100F. In FIG. 6, the differential input stage 40D shown in FIG. 5A is shown along with a mirror image thereof, and in output stage including a class AB bias stage, a P-channel pull-up transistor, and a N-channel pull-down transistor connected and shown to provide a rail-to-rail operational amplifier. Although not illustrated in FIG. 6, the rail-to-rail operational amplifier circuit needs bias circuitry to bias the upper and lower current mirrors in the folded cascode circuitry. The bias circuitry can be essentially the same as shown by reference 49 in above mentioned commonly owned U.S. Pat. No. 6,150,883 to provide a bias voltage $V_{BIAS2A}$ on the gates of transistors 8A and 9A. As another alternative, the "floating" current source disclosed in U.S. Pat. No. 5,311,145 issued May 10, 1984 to Huijsing et al. could be used.

It should be noted that in a general sense, this invention includes a very high precision current mirror which, when incorporated into an amplifier topology as described, provides an amplifier having properties which satisfy the aforementioned unmet needs. For example, in FIG. 5A the circuitry including NMOS transistors 33, 10, 11, 8, 9 and amplifier 16 connected as shown can be considered to constitute a stand-alone high precision current mirror. (However, the current mirror has limited output voltage range that limits its useful as a stand-alone current mirror.)

Similarly, the portion of the circuitry in FIG. 6 including PMOS transistors 33A, 10A, 11A and amplifier 160 can be considered to constitute a stand-alone high precision current mirror. In that case, the control loop including amplifier 160 and transistors 33A force the drain voltages of transistors 10A and 11A to track, thereby providing very high differential output impedance and matching output currents in the drains of transistors 10A and 11A.

As indicated earlier, the open-loop gain of a multi-stage amplifier can be viewed as the product of the gains of each stage within the amplifier. The gain of each stage can be expressed as $A=g_m R_{out}$. In the case of the final stage or output stage, the overall amplifier gain is load-dependant because $R_{OUT}=R_{LOAD}$. The gain of prior stages, if large enough, can render the change in output stage gain due to change in load conditions insignificant compared to the open-loop gain. When a two stage topology is implemented, it is very difficult to achieve enough gain in the first stage to render the change in output stage gain due to changing load conditions insignificant. However, this difficult objective is achieved by adding the gain boost of the present invention to the first stage.

Thus, the described invention boosts the voltage gain of a differential amplifier input stage without reducing its operating speed and without any penalty of increasing noise in the amplifier, by introducing local feedback which is not part of the signal gain path to increase the equivalent output impedance of the differential amplifier.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

What is claimed is:

1. A differential amplifier circuit comprising:
   (a) first and second supply voltage rails, first and second input terminals, and an output terminal;
   (b) differentially connected first and second input transistors of a first channel type to the first and second input terminals;
   (c) a folded cascode circuit coupled to the first supply voltage rail and including a first cascode transistor and a second cascode transistor both of a second channel type, sources of the first and second cascode transistors being coupled to drains of the first and second input transistors, respectively;
   (d) a first load transistor of the second channel type coupled between the source of the second cascode transistor and the first supply voltage rail and a second load transistor of the second channel type coupled between the source of the first cascode transistor and the first supply voltage rail;
   (e) a bias source producing a bias signal on gates of the first and second cascode transistors;
   (f) a third cascode transistor of the second channel type having a source coupled to a drain of the second cascode transistor and a drain coupled to a first current source, a drain of the first cascode transistor being coupled to a second current source, and a voltage level shift circuit coupled between the drain of the third cascode transistor and second load transistors; and
   (g) a gain boost amplifier having a first input coupled to the drain of the first cascode transistor, a second input coupled to the drain of the second cascode transistor, and an output coupled to a gate of the third cascode transistor.

2. The differential amplifier circuit of claim 1 including an output stage having an input coupled to the drain of the first cascode transistor, the output stage including a pull-up transistor of the second channel type coupled between the second supply voltage rail and the output terminal, and a second output transistor of the first channel type coupled between the first supply voltage rail and the output terminal.

3. The differential amplifier of claim 2 including a class AB bias circuit coupled between a gate electrode of the pull-up and a gate electrode of the pull-down transistor.

4. The differential amplifier of claim 2 wherein the gain boost amplifier is a CMOS voltage-input differential amplifier.

5. The differential amplifier of claim 2 wherein the gain boost amplifier is a CMOS current-input differential amplifier.

6. A method of operating a differential amplifier circuit which includes first and second supply voltage rails, first and second input terminals, and an output terminal, differentially connected first and second input transistors of a first channel type to the first and second input terminals, and a folded cascode circuit coupled to the first supply voltage rail and including a first cascode transistor and a second cascode transistor both of a second channel type, sources of the first and second cascode transistors being coupled to drains of the first and second input transistors, respectively, the sources of the first and second cascode transistors also being coupled to a drain of a first load transistor and a drain of a second load transistor, respectively, the method comprising:
   boosting the gain of the differential amplifier circuit without introducing additional components into a signal path of the differential amplifier circuit by providing local feedback representative of an output voltage of the differential amplifier circuit to gates of the first and second load transistors by
      (a) coupling a drain of a third cascode transistor of the second channel type to a current source circuit and coupling a source of the third cascode transistor to a drain of the second cascode transistor;
      (b) coupling a drain of the third cascode transistor to gates of the first and second load transistors; and
      (c) driving a gate of the third cascode transistor by means of a gain boost amplifier having a first input coupled to the drain of the first cascode transistor and a second input coupled to the drain of the second cascode transistor, to accomplish the function of increasing the output impedance of the differential amplifier circuit.

7. The method of claim 6 wherein step (b) includes driving a gate of the third cascode transistor by means of a level shift circuit coupled to the drain of the third cascode transistor.

* * * * *